(12) United States Patent
Kim

(10) Patent No.: US 6,345,007 B1
(45) Date of Patent: Feb. 5, 2002

(54) PREFETCH AND RESTORE METHOD AND APPARATUS OF SEMICONDUCTOR MEMORY DEVICE

(75) Inventor: Tae-Yun Kim, Kyoungki-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/722,358

(22) Filed: Nov. 28, 2000

(30) Foreign Application Priority Data

Nov. 30, 1999 (KR) .......................................... 99-53900

(51) Int. Cl.[7] ................................................. G11C 7/00
(52) U.S. Cl. ...................... 365/207; 365/190; 365/194; 365/233
(58) Field of Search ................................ 365/207, 190, 365/222, 189.01, 194, 189.08, 233

(56) References Cited

U.S. PATENT DOCUMENTS

| 5,253,211 A | * | 10/1993 | Suzuki | 365/222 |
| 5,371,715 A | * | 12/1994 | Kim | 365/233 |
| 5,418,753 A | * | 5/1995 | Seki | 365/207 |
| 5,465,230 A | * | 11/1995 | Montegari | 365/190 |
| 5,623,451 A | * | 4/1997 | Kawagoe | 365/189.01 |
| 5,881,006 A | * | 3/1999 | Yabe et al. | 365/207 |

* cited by examiner

*Primary Examiner*—Tan T. Nguyen
(74) *Attorney, Agent, or Firm*—Finnegan, Henderson, Farabow, Garrett & Dunner, L.L.P.

(57) ABSTRACT

An apparatus for pre fetching and restoring data stored in memory cells in a semiconductor memory device includes a bit line sense amplifying unit and a control unit. The bit line sense amplifying unit senses the data stored in the memory cells in response to a bit line sense amplifier driving signal. The control unit drives the bit line sense amplifying unit before data applied on pairs of bit lines are transferred to pairs of data bus lines in response to a control signal during a pre fetching operation. Additionally, the control unit drives the bit line sense amplifying unit after data applied on the pairs of bit lines via the pairs of data bus lines is transferred to the pairs of bit lines in response to the control signal.

6 Claims, 4 Drawing Sheets

PREFETCH AND RESTORE METHOD AND APPARATUS OF SEMICONDUCTOR MEMORY DEVICE

FIELD OF THE INVENTION

The present invention relates to a prefetch and restore method and apparatus of a semiconductor memory device; particularly to a method and apparatus for, in a restore operation, driving a bit line sense amplifier after write data on a pair of global data bus lines is delivered to a pair of bit lines, so as to reduce a size of a driver used to invert a logic value of data sensed by the bit line sense amplifier when logic values of cell data and the write data are opposite in a restore operation and also decrease a power consumption and a noise.

BACKGROUND OF THE INVENTION

In general, when a weak data signal stored in a cell of a memory cell array is provided onto a pair of bit lines BL and /BL, a bit line sense amplifier detects the weak data signal and amplifies the detected data signal into a power voltage Vcc or a ground voltage Vss according to a logic value of the detected data signal.

Hereinafter, there will be explained a prefetch (or read) and restore (or write) operation in such memory devices as a dynamic random access memory (DRAM), synchronous DRAM and DRAMs (CDRAM, EDRAM, VCM, and the like) employing a memory buffer therein.

First of all, in the read (or prefetch) operation, the data stored in the memory cell is coupled to a pair of transfer bus lines via the bit line sense amplifier and then temporarily stored in a channel buffer. The temporarily stored data is outputted to the outside of the memory device via a data output buffer and an output pad.

In the write (or restore) operation, the write data inputted through an input pad is temporarily stored in the channel buffer via a data input buffer and then stored in the memory cell through the pair of data bus lines and the pair of bit lines.

There will be explained in detail the read or prefetch operation reading out cell data stored in a memory cell.

If a row address is inputted to the inside of the memory device, a word line corresponding to the row address is activated and a corresponding cell data is retrieved onto a pair of bit lines BL and /BL by a charge distribution. Then, if control signals RTO and SB are enabled to drive a bit line sense amplifier, the bit line sense amplifier amplifies a weak data signal on the pair of bit lines BL and /BL into the power voltage Vcc or the ground voltage Vss according to a logic value of the data signal. The time required from the inputting of the row address to the sensing of the data signal is called as a row active time tRCD.

After the row address is inputted, if a column address is inputted, a pair of bit lines BL and /BL selected by the column address are connected to a pair of global data bus lines GDB and /GDB and, hence, the data on the pair of bit lines BL and /BL are transferred onto the pair of global data bus lines GDB and /GDB.

The data on the pair of global data bus lines are amplified by the data line sense amplifier and then outputted to the outside of the memory device via a corresponding data output buffer.

There will be explained in detail the write or restore operation writing data onto a memory cell.

If a row address is inputted to the inside of the memory device, a word line corresponding to the row address is activated and a corresponding cell data is fed onto a pair of bit lines BL and /BL by the charge distribution. Then, if control signals RTO and SB are enabled to drive a bit line sense amplifier, the bit line sense amplifier amplifies the weak data signal on the pair of bit lines BL and /BL into the power voltage Vcc or the ground voltage Vss according to a logic value of the data signal. The time required for the above process is referred to as the row active time tRCD.

After then, if the pair of bit lines BL and /BL selected by the column address are connected to a corresponding pair of global data bus lines GDB and /GDB, write data is delivered onto the pair of global data bus lines GDB and /GDB in response to an operation of a write driver. At this time, since the pair of global data bus lines and the pair of bit lines are connected to each other, the write data on the pair of global data bus lines are transferred onto the pair of bit lines. Accordingly, the write data on the pair of bit lines are stored in the memory cell.

Referring to FIG. 1, there is illustrated a schematic diagram of explaining a structure of a virtual channel memory (VCM).

As described in FIG. 1, the VCM comprises a multiplicity of cell array units 10<0> to 10<N> each of which includes a plurality of memory cells; pairs of bit lines BL and BLB for connecting the memory cells with bit line sense amplifying units 20<0> to 20<N>; the bit line sense amplifying units 20<0> to 20<N> for detecting and amplifying the data on the pairs of bit lines BL and BLB; pairs of transfer bus lines TB<0> to TB<N> and TBB<0> to TBB<N> for connecting the bit line sense amplifying units 20<0> to 20<N> to a channel buffering unit 30; transfer transistors N1 and N2, and N3 and N4 for switching, in response to a control signal TB_CTRL, data between the pairs of bit lines BL and BLB and the respective pairs of transfer bus lines TB<0> to TB<N> and TBB<0> to TBB<N>; the channel buffering unit 30 for storing the data provided through the pairs of transfer bus lines TB<0> to TB<N> and TBB<0> to TBB<N>, or storing data provided from a read sense amplifier/write driver 40; the read sense amplifier/write driver 40 for accessing data from the channel buffering unit 30 or delivering data to the channel buffering unit 30; and an input/output (DQ) buffer/pad 50 for buffering data provided from the read sense amplifier 40 and outputting the data through an output pad, and buffering write data inputted through an input pad and transferring the write data to the write driver 40.

In the prefetch (or read) operation of the above VCM, if a certain word line is activated along with a row path generated by a prefetch instruction, data stored in all of cells connected to the certain word line are coupled onto their respective pairs of bit lines BL and BLB. Then, if the sense amplifier driving signals RTO and SB are enabled in response to a control signal SG, all of bit line sense amplifying units 20<0> to 20<N> corresponding to the pairs of bit lines BL and BLB are activated and the data on the pairs of bit lines BL and BLB are sensed into the power voltage Vcc or the ground voltage Vss.

The sensed data on the pairs of bit lines BL and BLB are temporarily stored in the channel buffering unit 30 via the transfer bus lines TB<0> to TB<N> and TBB<0> to TBB<N> and then amplified by the data bus line read sense amplifier 40 to thereby being outputted to the outside of the memory device through the DQ buffer/pad 50.

On the other hand, in the restore (or write) operation, write data are temporarily stored in the channel buffering unit 30 after being inputted via the input pad, the input buffer and the write driver in response to a write instruction. In order to store the temporarily stored data in the memory cells, a word line corresponding to the row path is actuated and, thereafter, the data stored in the memory cells are provided onto the pairs of bit lines BL and BLB by the charge distribution.

Referring to FIG. 2, there is shown a schematic diagram of explaining a process for generating conventional sense amplifier driving signals RTO and SB.

First of all, if a /RAS signal is enabled, a word line corresponding to an inputted row address is activated and then a sense amplifier driving signal generating circuit 22 is activated in response to a control signal SG to thereby produce the bit line sense amplifier driving signals RTO and SB.

Referring to FIG. 3, there is described a timing diagram of showing an activating order of a transfer bus line control signal TB_CTRL and sense amplifier driving signals RTO and SB in a prefetch operation.

As shown in FIG. 3, after a word line W/L is enabled, a pull-up bias voltage signal RTO and a pull-down voltage signal SB are generated to thereby drive the bit line sense amplifying units 20<0> to 20<N>. Then, the control signal TB_CTRL is produced to thereby provide the pairs of transfer bus lines TB<0> to TB<N> and TBB<0> to TBB<N> with the data on the pairs of bit lines BL and BLB amplified by the bit line sense amplifying units 20<0> to 20<N>. In response to the control signal TB_CTRL, the transfer transistors N1, N2, N3 and N4 are turned on and the amplified cell data on the pairs of bit lines BL and BLB are delivered onto the pairs of transfer bus lines TB<0> to TB<N> and TBB<0> to TBB<N>.

In the conventional bit line sense amplifier control circuit, if data stored in a cell is identical to data to be written, there is no problem. However, if the above two data are different from each other, there may occur following problems.

That is, in the write or restore operation storing the data in the memory cell, since the row path is first actuated, a certain data of a cell is provided onto a pair of bit lines and then amplified by the sense amplifier into the power voltage Vcc or the ground voltage Vss. Then, as the column path is actuated, if the pair of bit lines is connected to the pair of global data bus lines, the write driver must invert a sensed opposite data. Therefore, a size of the write driver should be large enough to invertly operate the continuously operating bit line sense amplifier as well as inverting the opposite data on the pair of bit lines and the pair of global data bus lines. Further, in order to invert the opposite data, there needs a large amount of power consumption.

Moreover, the operation of the memory device may be entirely unstable due to a noise on a power line caused by the great power consumption.

Specifically, since dozens of or hundreds of bits of data are prefetched or restored in one operation in special DRAMs such as cache DRAM (CDRAM), VCD, enhance DRAM (EDRAM), enbaded frame (EF) buffer and multibank DRAM, the power consumption and the noise can be critical problems.

SUMMARY OF THE INVENTION

It is, therefore, an object of the present invention to provide a method and apparatus for, in a restore operation, driving a bit line sense amplifier after write data on a pair of global data bus lines is delivered to a pair of bit lines, so as to reduce a size of a driver used to invert a logic value of data sensed by the bit line sense amplifier when logic values of cell data and the write data are opposite in a restore operation and also decrease a power consumption and a noise.

In accordance with one aspect of the present invention, there is provided a method for pre fetching and restoring data stored in memory cells in a semiconductor memory device, comprising the steps of: a) performing a pre fetching operation, the pre fetching operation including the steps of: applying the data onto pairs of bit lines after a specific word line is activated by a row path; sensing the data applied on the pairs of bit lines by bit line sense amplifiers driven in response to an enabled bit line sense amplifier driving signal; and transferring the data applied on the pairs of bit lines to pairs of global data bus lines in response to a control signal for connecting the pairs of bit lines with the pairs of global data bus lines, and b) performing a restoring operation, the restoring operation including the steps of: applying the data on the pairs of bit lines when the specific word line is activated by the row path; applying write data on the pairs of global data bus lines; transferring the write data applied on the pairs of global data bus lines to the pairs of bit lines in response to the control signal; and sensing the write data applied on the pairs of bit lines by the bit line sense amplifiers to store sensed write data into the memory cells.

In accordance with another aspect of the present invention, there is a provided an apparatus for pre fetching and restoring data stored in memory cells in a semiconductor memory device having a memory buffer, comprising: a bit line sense amplifying means for sensing the data stored in the memory cells in response to a bit line sense amplifier driving signal; and a control means for driving the bit line sense amplifying means before data applied on pairs of bit lines are transferred to pairs of data bus lines in response to a control signal during a pre fetching operation, and for driving the bit line sense amplifying means after data applied on the pairs of bit lines via the pairs of data bus lines is transferred to the pairs of bit lines in response to the control signal.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
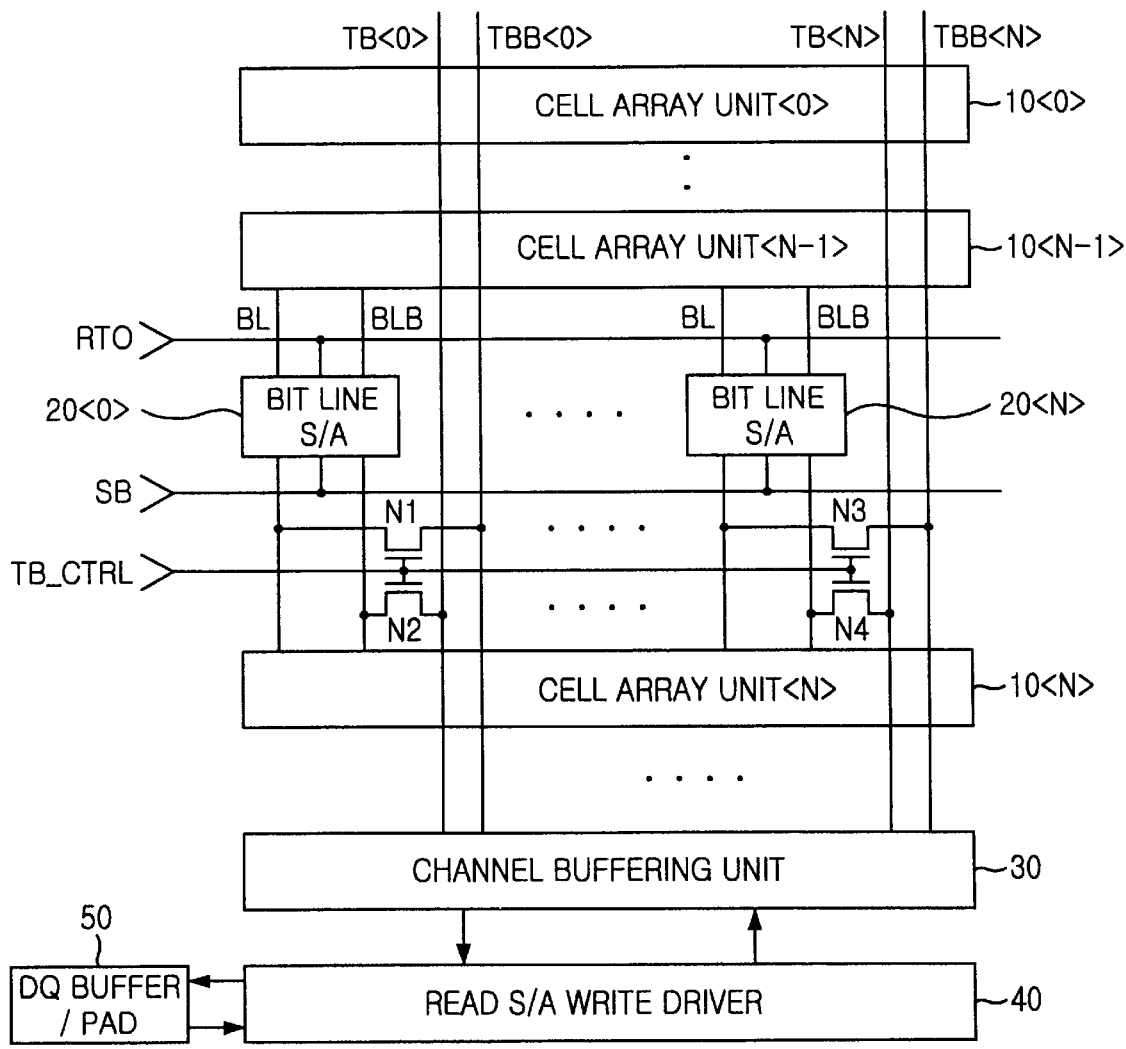
FIG. 1 illustrates a schematic diagram of explaining a structure of a virtual channel memory (VCM)

While referring to the drawings, some of the preferred embodiments of the present invention will be explained in detail.

Further, in the drawings, all components having same functions are represented by identical reference numbers and their operations are not repeatedly explained for the sake of simplicity.

Figure 2:
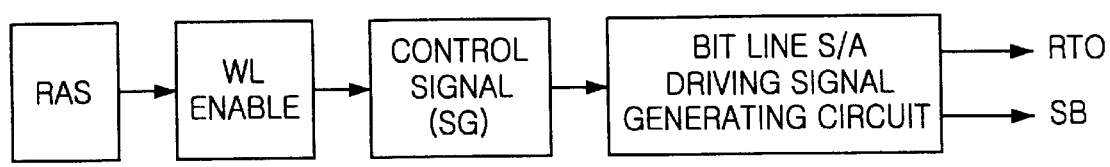
FIG. 2 shows a schematic diagram of representing a process generating conventional sense amplifier driving signals.
Figure 3:
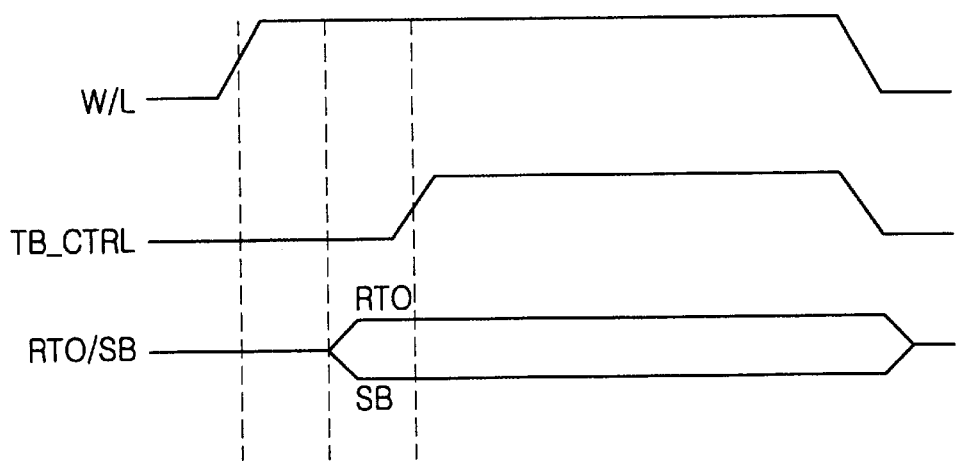
FIG. 3 is a timing diagram of showing an activating order of a transfer bus line control signal and sense amplifier driving signals in a prefetch operation.

Likewise to FIGS. 2 and 3, in a prefetch (or read) operation reading out data stored in a memory cell array of a DRAM having a memory buffer in accordance with the present invention, if a word line W/L is activated by an activated row path, corresponding cell data are provided onto associated pairs of bit lines by the charge distribution and then bit line sense amplifiers are driven by enabled sense amplifier driving signals RTO and SB. The data sensed by the bit line sense amplifiers are transferred onto pairs of global data bus lines since the transfer transistors are turned on in response to a control signal TB_CTRL.

Figure 4:
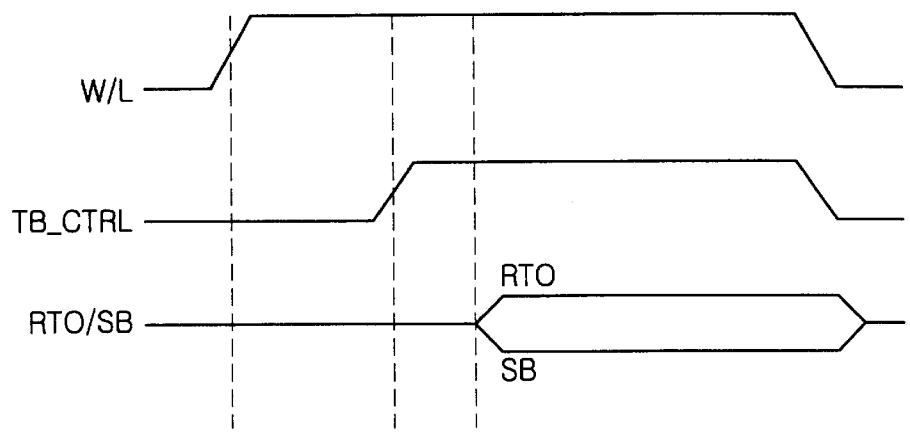
FIG. 4 provides an operational timing diagram of showing an activating order of a transfer bus line control signal and sense amplifier driving signals in a prefetch operation in accordance with the present invention.

As depicted in FIG. 4, in a restore (or write) operation writing data in a memory cell, if a word line W/L is activated by an activated row path, corresponding cell data are coupled onto associated pairs of bit lines by the charge distribution. Then, once write data is provided onto a corresponding pair of global data bus lines and, in response to the control signal TB_CTRL, the write data on the pair of global data bus lines is provided onto an associated pair of bit lines, sense amplifier driving signals RTO and SB are actuated to thereby drive the bit line sense amplifiers.

Figure 5:
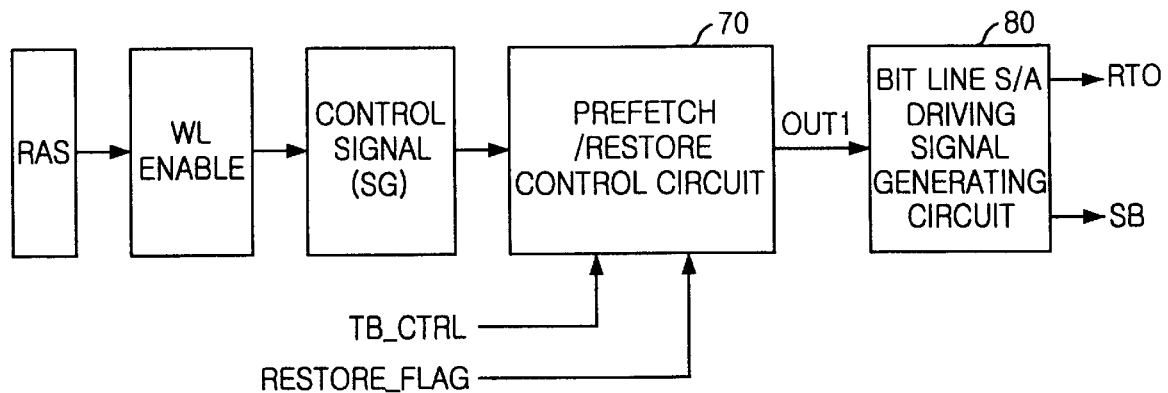
FIG. 5 depicts a flow of generating bit line sense amplifier driving signals in accordance with the present invention.

In FIG. 5, there is provided a flow of generating bit line sense amplifier driving signals in accordance with the present invention.

If an enabled /RAS signal is inputted, a word line corresponding to an inputted row address is activated. Then, a bit line sense amplifier driving signal control circuit 80 is actuated in response to the activation of a prefetch/restore control circuit 70 to thereby produce the bit line sense amplifier driving signals RTO and SB.

The prefetch/restore control circuit 70 generates the bit line sense amplifier driving signals RTO and SB in order to drive the bit line sense amplifiers only after the word line is activated and then the cell data are coupled onto pairs of bit lines in the prefetch (or read) operation. On the other hand, in the restore (or write) operation, the circuit 70 produces the bit line sense amplifier driving signals RTO and SB so as to drive the bit line sense amplifiers only after the word line is activated and in turn the write data on a corresponding pair of data bus lines is transferred to a pair of bit lines connected to the corresponding pair of data bus lines.

Therefore, in the restore operation, since the bit line sense amplifier driving signals RTO and SB are not enabled until the control signal TB_CTRL, connecting the pair of bit lines and the pair of data bus lines, is enabled, the bit line sense amplifier also is not activated until the time. As a result, since, in the restore operation, the bit line sense amplifier operates after the write data on the pair of data bus lines is coupled onto the pair of bit lines in response to the enabled transfer transistor control signal TB_CTRL, there need not to make a size of the write driver as large as that of the conventional write driver although the data stored in the cell and the data to be written have opposite voltage levels.

Figure 6:
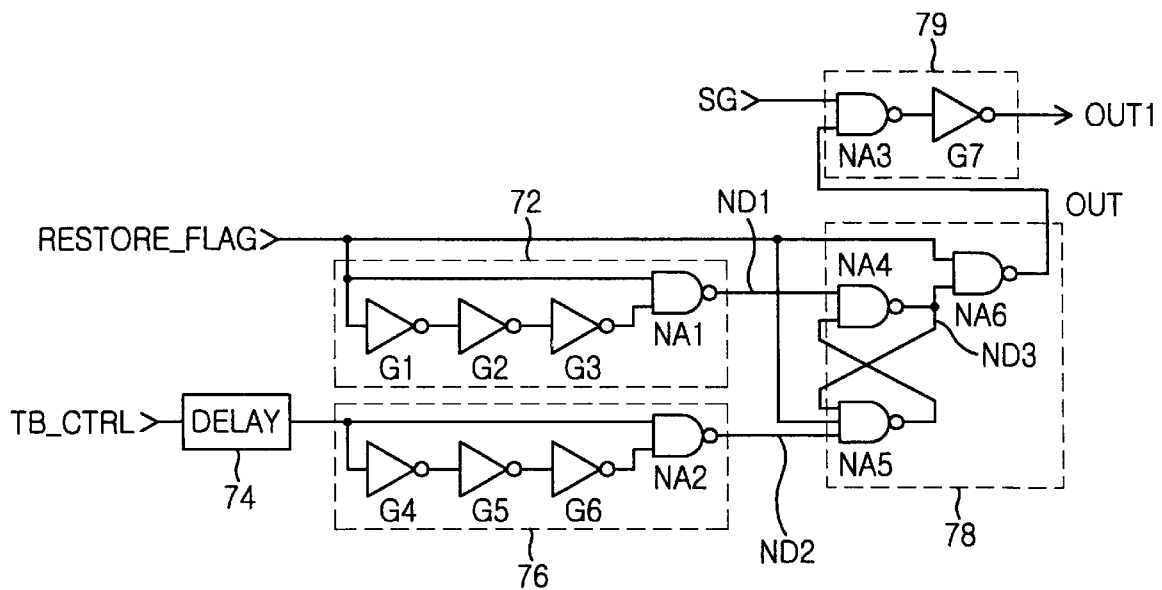
FIG. 6 represents a detailed circuit diagram of a prefetch/restore control circuit in accordance with the present invention.

Referring to FIG. 6, there is shown a detailed circuit diagram of the prefetch/restore control circuit 70.

The prefetch/restore control circuit 70 comprises a first pulse signal generating unit 72 for producing a first pulse signal having a predetermined period when a restore signal RESTORE_FLAG is enabled; a delay unit 74 for delaying the transfer transistor control signal TB_CTRL by a preset time; a second pulse signal generating unit 76 for producing a second pulse signal having a given period when the delayed transfer transistor control signal is enabled; a latch unit 78 employing a NAND latching unit receiving the first and the second pulse signals as its inputs, and a NAND gate receiving an output of the NAND latching unit and a RESTORE_FLAG signal generated in the restore operation as its inputs; and a logic circuit unit 79 consisting of a NAND gate and an inverter and receiving an output signal of the latch unit 78 and the signal SG generated when the word line is activated.

The first pulse signal generating unit 72 includes three numbers of inverters G1 to G3 for generating an inverted signal having the predetermined delay time based on the restore signal RESTORE_FLAG, and a NAND gate for performing a NAND operation by using the restore signal RESTORE_FLAG and an output of the inverter G3. The second pulse signal generating unit 76 has a similar structure to that of the first pulse signal generating unit 72 and includes three numbers of inverters G4 to G6 and a NAND gate NA2.

The first logic circuit unit 78 employs a flip-flop consisting of two NAND gates NA4 and NA5 and a NAND gate NA6 connected to an output node of the flip-flop. The second logic circuit unit 79 includes a NAND gate NA3 and an inverter G7.

Figure 7:
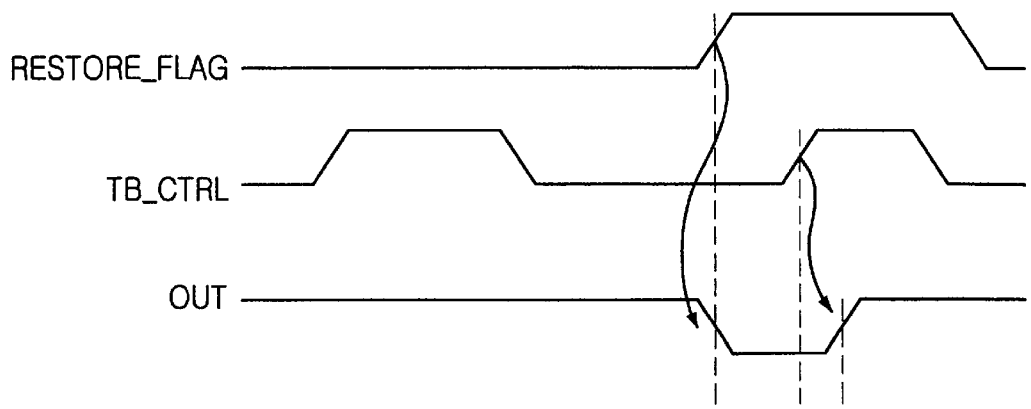
FIG. 7 describes an operational timing diagram of the prefetch/restore control circuit in FIG. 6.

As shown in FIG. 3, in the prefetch operation, the prefetch/restore control circuit unit 70 generates the bit line sense amplifier driving signals RTO and SB in response to the control signal SG after the restore signal RESTORE_FLAG is inactivated. On the other hand, in the restore operation, as shown in FIG. 7, the bit line sense amplifier driving signal RTO and SB are produced in a given delay time after the transfer transistor control signal TB_CTRL is enabled.

As described above, by using the present method and apparatus for driving, in the restore operation, the bit line sense amplifier after the write data on the pair of global data bus lines is delivered onto the pair of bit lines, the size of the write driver can be reduced and hence the power consumption and the noise can be also decreased.

While the present invention has been described with respect to the particular embodiments, it will be apparent to those skilled in the art that various changes and modifications may be made without departing from the spirit and scope of the invention as defined in the following claims.

What is claimed is:

1. A method for pre fetching and restoring data stored in memory cells in a semiconductor memory device, comprising the steps of:
   a) performing a pre fetching operation, the pre fetching operation including the steps of:
      applying the data onto pairs of bit lines after a specific word line is activated by a row path;
      sensing the data applied on the pairs of bit lines by bit line sense amplifiers driven in response to an enabled bit line sense amplifier driving signal; and
      transferring the data applied on the pairs of bit lines to pairs of global data bus lines in response to a control signal for connecting the pairs of bit lines with the pairs of global data bus lines, and b) performing a restoring operation, the restoring operation including the steps of:
applying the data on the pairs of bit lines when the specific word line is activated by the row path;
applying write data on the pairs of global data bus lines;
transferring the write data applied on the pairs of global data bus lines to the pairs of bit lines in response to the control signal; and
sensing the write data applied on the pairs of bit lines by the bit line sense amplifiers to store sensed write data into the memory cells.

2. The method as recited in claim 1, wherein levels of the cell data on the pairs of bit lines are sensed to a power voltage or a ground voltage by the sense amplifiers.

3. The method as recited in claim 1, wherein, in the step a), the bit line sense amplifier driving signal is activated along the row path by an disablement of the control signal generated in the step b); and
wherein, in the step b), the bit line sense amplifier driving signal is enabled after a predetermined delay time is passed from an enabling of the control signal.

4. An apparatus for pre fetching and restoring data stored in memory cells in a semiconductor memory device having a memory buffer, comprising:
a bit line sense amplifying means for sensing the data stored in the memory cells in response to a bit line sense amplifier driving signal; and
a control means for driving the bit line sense amplifying means before data applied on pairs of bit lines are transferred to pairs of data bus lines in response to a control signal during a pre fetching operation, and for driving the bit line sense amplifying means after data applied on the pairs of bit lines via the pairs of data bus lines is transferred to the pairs of bit lines in response to the control signal.

5. The apparatus as recited in claim 4, wherein the bit line sense amplifier driving signal is activated along the row path by an disablement of the control signal generated during the pre fetching operation; and
wherein the bit line sense amplifier driving signal is enabled after a predetermined delay time is passed from an enabling of the control signal.

6. The apparatus as recited in claim 5, wherein the control means includes:
a first pulse signal generating unit for producing a first pulse signal when a restore signal is enabled, the first pulse signal has a predetermined period;
a delay unit for delaying the control signal for a predetermined delay time to output a delayed control signal;
a second pulse signal generating unit for producing a second pulse signal when the delayed control signal is enabled;
a latching unit for latching the first pulse signal and the second pulse signal, the latching means including an input unit for receiving the first pulse signal and the second pulse signal, and a NAND gate for NANDing an output of the input unit and the restore signal; and
a logic circuit unit, the logic circuit unit including a NAND gate for NANDing an output of the latching unit and a signal that is enabled when the word line are activated, and an inverter for inverting an output of the NAND gate.

* * * * *